United States Patent
Kim et al.

(10) Patent No.: US 6,909,386 B1
(45) Date of Patent: Jun. 21, 2005

(54) DUO-BINARY ENCODER AND OPTICAL DUO-BINARY TRANSMISSION APPARATUS

(75) Inventors: Sung-Kee Kim, Suwon-si (KR); Han-Lim Lee, Seoul (KR); Seong-Taek Hwang, Pyeongtaek-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/858,919

(22) Filed: Jun. 2, 2004

(30) Foreign Application Priority Data

Dec. 1, 2003  (KR) ................................ 10-2003-0086248

(51) Int. Cl.$^7$ .............................................. H03M 1/00
(52) U.S. Cl. ...................................... 341/111; 341/137
(58) Field of Search .......................... 341/111, 50, 137, 341/110, 160

(56) References Cited

U.S. PATENT DOCUMENTS

| | | | | |
|---|---|---|---|---|
| 3,836,904 A | * | 9/1974 | Cross ........................... | 341/70 |
| 4,618,941 A | * | 10/1986 | Linder et al. ................ | 708/319 |
| 5,124,979 A | * | 6/1992 | Matui .......................... | 370/496 |
| 5,365,229 A | * | 11/1994 | Gardner et al. ............ | 340/855.4 |
| 5,451,953 A | * | 9/1995 | Duffield ....................... | 341/176 |
| 6,842,125 B2 | * | 1/2005 | Mauro et al. ................ | 341/69 |

* cited by examiner

Primary Examiner—Peguy JeanPierre
(74) Attorney, Agent, or Firm—Cha & Reiter, L.L.C.

(57) ABSTRACT

An optical duo-binary transmission apparatus using an optical duo-binary transmission method is disclosed. The apparatus includes a duo-binary encoder that performs parallel processing. The duo-binary encoder includes a level change detection unit for detecting that levels of data input signals of N channels input at an $n^{th}$ input of channels change from 0 to 1, or from 1 to 0; a judgment unit for judging whether a number of level changes detected by the level change detection unit is odd or even; and a toggle unit for toggling an output signal of the judgment unit when the number of level change is odd. The encoder also includes an intermediate signal generation unit for determining whether phases of other channels are shifted or not, according to an data input signal on the basis of a predetermined channel of the N channels; and a phase division unit for dividing data into a first data group having non-shifted phases and a second data group which require a phase shift, according to an output signal of the intermediate signal generation unit and the data input signal, and outputting the divided first and second data groups.

14 Claims, 7 Drawing Sheets

DUO-BINARY ENCODER AND OPTICAL DUO-BINARY TRANSMISSION APPARATUS

CLAIM OF PRIORITY

This application claims priority to an application entitled "Duo-binary encoder and optical duo-binary transmission apparatus using the same," filed in the Korean Intellectual Property Office on Dec. 1, 2003 and assigned Serial No. 2003-86248, the contents of which are hereby incorporated by reference.

BACKGROUND OF THE INVENTION

1. Field of the Invention

The present invention relates to an optical duo-binary transmission apparatus, and more particularly to a parallel processing, duo-binary encoder and an optical duo-binary transmission apparatus using such an encoder.

2. Description of the Related Art

In general, a conventional Dense Wavelength Division Multiplexing (hereinafter, referred to as a DWDM) optical transmission system can transmit an optical signal having multiple channels with different wavelengths through a single optical fiber. The DWDM system can transmit an optical signal regardless of transmission speed. Because of these features, such DWDM systems are widely used in ultra-high speed Internet networks. Conventional systems are known that can transmit more than a hundred channels through a single optical fiber using the DWDM technology. In addition, research is being conducted to develop a system that can transmit more than two hundred channels of 40 Gbps through a single optical fiber simultaneously, thus having a transmission speed of more than 10 Tbps.

However, the enlargement of transmission capacity is restricted due to severe interference and distortion between channels. This is because the channel distance is less than 50 GHz when the light intensity is modulated using the conventional non-return-to-zero (NRZ) method, which is due to a rapid increase of data traffic and a request for high-speed transmission of data of more than 40 Gbps. Transmission distance is restricted in high-speed transmission of more than 10 Gbps since a direct current (DC) frequency component of a conventional binary NRZ transmission signal and a high frequency component spread during modulation cause non-linearity and dispersion when the binary NRZ transmission signal propagates in an optical fiber medium.

Optical duo-binary technology may be an optical transmission technology capable of overcoming restrictions in transmission distance due to chromatic dispersion. A main advantage of the duo-binary transmission is that the transmission spectrum is reduced in comparison to the general binary transmission. In a dispersion restriction system, the transmission distance is in inverse proportion to the square of the transmission spectrum bandwidth. This means that, when the transmission spectrum is reduced by ½, the transmission distance increases four times. Since the carrier frequency is suppressed in a duo-binary transmission spectrum, it is possible to relax the restriction of the optical power output caused by Brillouin scattering excited in the optical fiber.

FIG. 1 is a block diagram showing the construction of a conventional optical duo-binary transmission apparatus 100. The conventional optical duo-binary transmission apparatus 100 includes a multiplexer 101, a precoder 102, a low pass filter 103, a modulator driving amplifier 104, a laser source 105 for outputting a carrier, and a Mach-Zehnder interferometer type optical intensity modulator 106. The multiplexer 101 multiplexes data input signals of N number of channels and outputs the multiplexed signal. The precoder 102 then encodes the multiplexed signal. The low pass filter 103 converts a 2-level NRZ electrical signal output from the precoder 102 into a 3-level electrical signal and reduces the bandwidth of the signal. The modulator driving amplifier 104 amplifies the 3-level electrical signal to output an optical modulator driving signal.

Hereinafter, an operation of the conventional optical duo-binary transmission apparatus having the above-mentioned construction will be described.

Referring again to FIG. 1, the input signals of N number of channels are multiplexed by the multiplexer 101, and the multiplexed signal is then encoded by the precoder 102. The 2-level binary signal output from the precoder 102 is input to the low pass filter 103, and the low pass filter 103 has a bandwidth corresponding to about ¼ of a clock frequency of the 2-level binary signal. This excessive limitation to the bandwidth causes interference between codes, which thus changes the 2-level binary signal to a 3-level duo-binary signal. The 3-level duo-binary signal is then amplified by the modulator driving amplifier 104 and used as a driving signal of the Mach-Zehnder interferometer type optical intensity modulator 106. The carrier output from the laser source 105 is subjected to phase and optical intensity modulation according to the driving signal of the Mach-Zehnder interferometer type optical intensity modulator 106 and is then output as a 2-level optical duo-binary signal.

FIG. 2 is a view showing a pattern and a phase shift of an output optical signal when a signal having a data sequence of 11011000100110011101 is transmitted by means of the optical duo-binary transmission apparatus in FIG. 1. In FIG. 2, whenever the data input signal becomes '0', the phase of the data input signal is shifted by π.

However, according to the prior art, in generating the 3-level data signal by the electric low pass filter, transmission characteristics deteriorate in a manner that depends on the pattern of an input signal.

Further, according to the prior art, since n number of input optical signals are multiplexed through a multiplexer, and the multiplexed data are then encoded by a precoder, data transmission speed increases n times in comparison with the transmission speed before multiplexing. The means that a high speed precoder that corresponds to the data transmission speed is required. However, in the case of the conventional precoder, it has a structure including an exclusive OR (hereinafter, referred to as an XOR) gate and a time delay unit for delaying an output signal of the XOR gate by 1 data bit and feed backing the delayed signal. Therefore, in the case of a high speed data signal, it is difficult to realize a high speed precoder due to time delay and limitation in the operational speed of the XOR gate.

In addition, such prior art systems have a characteristic in which a phase shift occurs at each '0'. It is noted that when the number of consecutive '0's is even, the phase shift does not occur between data of the consecutive '0's and at least one '1' adjacent to the consecutive '0's.

FIG. 3 is a block diagram showing the construction of another conventional optical duo-binary transmission apparatus. FIG. 4 is a view showing output signals at points ①, ②, ③, ④, and ⑤ when the data sequence of 11011000100110011101 is transmitted by means of the optical duo-binary transmission apparatus shown in FIG. 3

In FIG. 3, the conventional optical duo-binary transmission apparatus 200 includes a multiplexer 201, an encoder 202, a coupler or an adder 203, a modulator driving amplifier 204, a laser source 205 for outputting a carrier, and a Mach-Zehnder interferometer type optical intensity modulator 206. The multiplexer 201 multiplexes data input signals of N number of channels and outputs the multiplexed signal, and the encoder 202 encodes the multiplexed signal so that the multiplexed signal includes phase information. The coupler 203 converts the encoded signal into a 3-level electrical signal, and the modulator driving amplifier 204 amplifies the 3-level electrical signal and outputs an optical modulator driving signal.

According to the conventional optical duo-binary transmission apparatus 200, a low pass filter and a precoder are unnecessary. Instead, in order to enable the apparatus to have a phase shift which is main characteristic of an optical duo-binary signal, the encoder 202 outputs data ② having non-shifted phases and data ③ requiring a phase shift. The output signals ② and ③ of the encoder 202 a reconverted into a 3-level signal ④ by the coupler 203, and the converted signal is passed through the optical intensity modulator 206 and is then output as an optical duo-binary signal ⑤ with a phase shift.

Similar to the apparatus shown in FIG. 1, since the optical duo-binary transmission apparatus in FIG. 3 multiplexes the input signals of N number of channels and then encodes the multiplexed signal, the apparatus requires a high speed encoder. However, such a high speed precoder cannot be realized due to operation speed limitations in the electrical device constituting the encoder.

SUMMARY OF THE INVENTION

One aspect of the present invention relates to a duo-binary encoder that can achieve a high speed even with existing low speed electrical elements.

Another aspect of the present invention relates to a duo-binary encoder which reduces or minimizes any influence due to a data pattern of an input signal by causing a 180° phase shift between data of consecutive '0's and at least one '1' adjacent to the consecutive '0's, even when the number of consecutive '0's of an input data signal is even.

Another aspect of the present invention relates to an optical duo-binary transmission apparatus that is less susceptible to wavelength dispersion than convention devices and that does not use a feedback type precoder or a electrical low pass filter.

One embodiment of the present is directed to a duo-binary encoder including a level change detection unit for detecting that levels of data input signals of N channels input at an $n^{th}$ input of channels change from 0 to 1, or from 1 to 0 and a judgment unit for judging whether a number of level changes detected by the level change detection unit is odd or even. The encoder also includes a toggle unit for toggling an output signal of the judgment unit when the number of level change is odd, an intermediate signal generation unit for determining whether phases of other channels are shifted or not, according to an data input signal on the basis of a predetermined channel of the N channels; and a phase division unit for dividing data into a first data group having non-shifted phases and a second data group which require a phase shift, according to an output signal of the intermediate signal generation unit and the data input signal, and outputting the divided first and second data groups.

Another embodiment of the present is directed to an optical duo-binary transmission apparatus including an encoder for dividing N number of data input signals into a first data group having non-shifted phases and a second data group which require a phase shift, by a parallel processing, and outputting the divided first and second data groups and a first/second multiplexer for multiplexing the first data group having non-shifted phases and the second data group which require a phase shift, respectively. The apparatus also includes a coupler for coupling signals respectively multiplexed by the first/second multiplexer and outputs a 3-level signal; a light source for outputting an optical carrier; and an optical modulator for modulating the optical carrier into an optical duo-binary signal by the 3-level signal, and outputting the modulated signal. The encoder includes a level change detection unit for detecting that levels of data input signals of N channels input at an $n^{th}$ input of channels change from 0 to 1, or from 1 to 0; a judgment unit for judging whether a number of level changes detected by the level change detection unit is odd or even; and a toggle unit for toggling an output signal of the judgment unit when the number of level change is odd. The encoder also includes an intermediate signal generation unit for determining whether phases of other channels are shifted or not, according to an data input signal on the basis of a predetermined channel of the N channels; and a phase division unit for dividing data into a first data group having non-shifted phases and a second data group which require a phase shift, according to an output signal of the intermediate signal generation unit and the data input signal, and outputting the divided first and second data groups.

BRIEF DESCRIPTION OF THE DRAWINGS

The above and other aspects, features and embodiments of the present invention will be more apparent from the following detailed description taken in conjunction with the accompanying drawings, in which.

DETAILED DESCRIPTION

Figure 1:
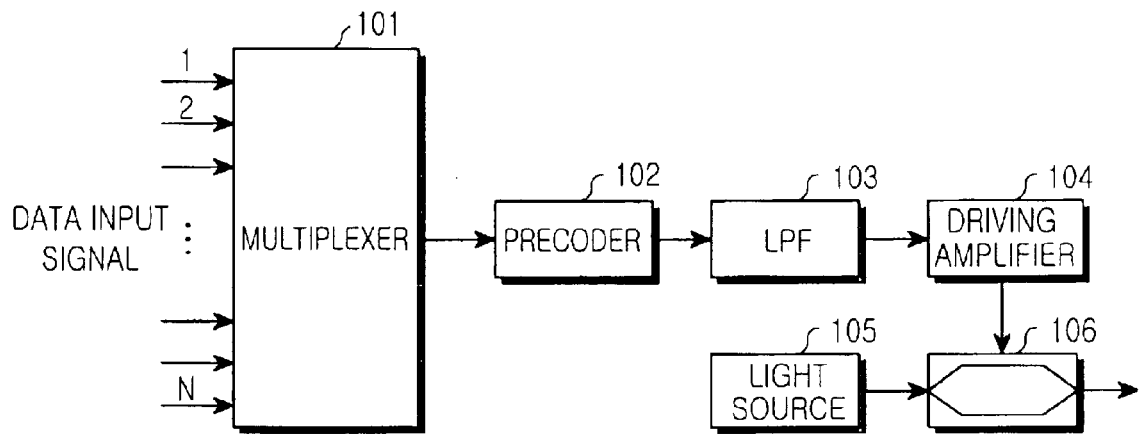
FIG. 1 is a block diagram showing the construction of a conventional optical duo-binary transmission apparatus.
Figure 2:
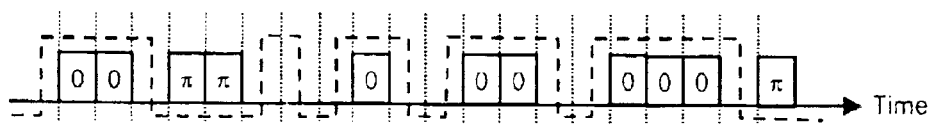
FIG. 2 is a view showing an example of an output signal obtained by using the optical duo-binary transmission apparatus in FIG. 1.
Figure 3:
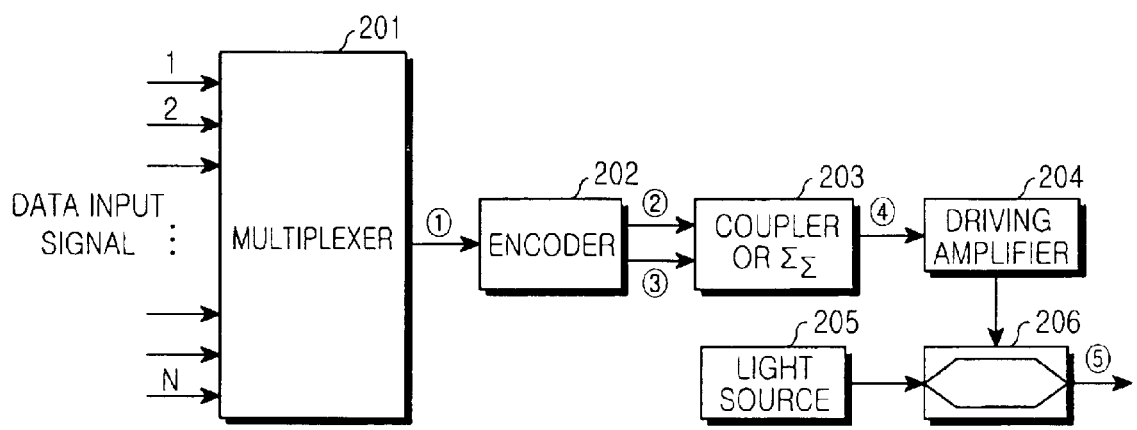
FIG. 3 is a block diagram showing the construction of another conventional optical duo-binary transmission apparatus.

Hereinafter, embodiments according to the present invention will be described with reference to the accompanying drawings. The same reference numerals are used to designate the same elements as those shown in other drawings. For the purposes of clarity and simplicity, a detailed description of known functions and configuration incorporated herein will be omitted as it may obscure the subject matter of the present invention unclear.

Figure 5:
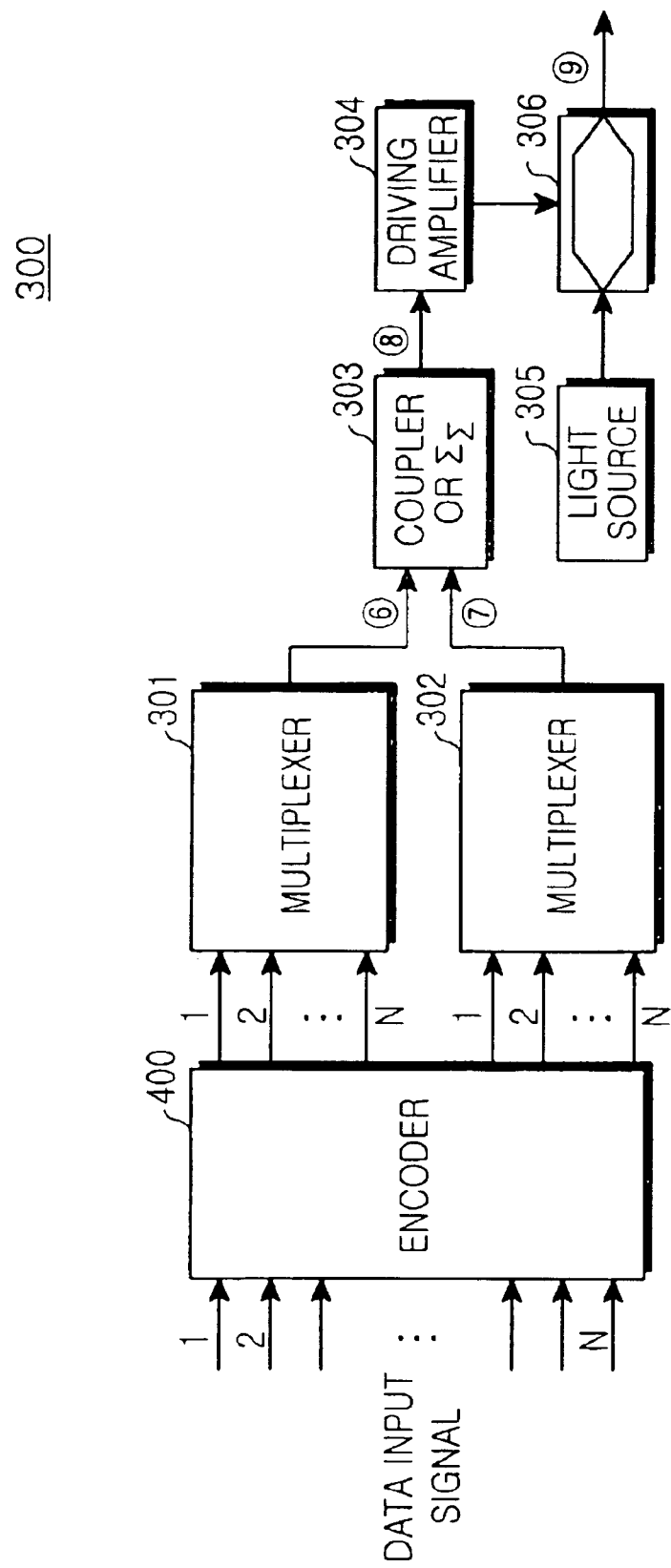
FIG. 5 is a block diagram showing the construction of an optical duo-binary transmission apparatus according to one embodiment of the present invention.

FIG. 5 is a block diagram showing a construction of an optical duo-binary transmission apparatus 300 according to a first embodiment of the present invention. The optical duo-binary transmission apparatus 300 includes an encoder 400, a first and a second multiplexers 301 and 302, a coupler or an adder 303, a driving amplifier 304, a laser source 305 for outputting a carrier, and a Mach-Zehnder interferometer type optical intensity modulator 306. The encoder 400 encodes N number of data input signals. The first and the second multiplexers 301 and 302 multiplex the encoded signals. The coupler 303 couples signals output from the first and the second multiplexers 301 and 302. The driving amplifier 304 amplifies an output signal of the coupler 303.

The encoder 400 encodes input signals of the N number of channels by parallel processing.

Figure 6:
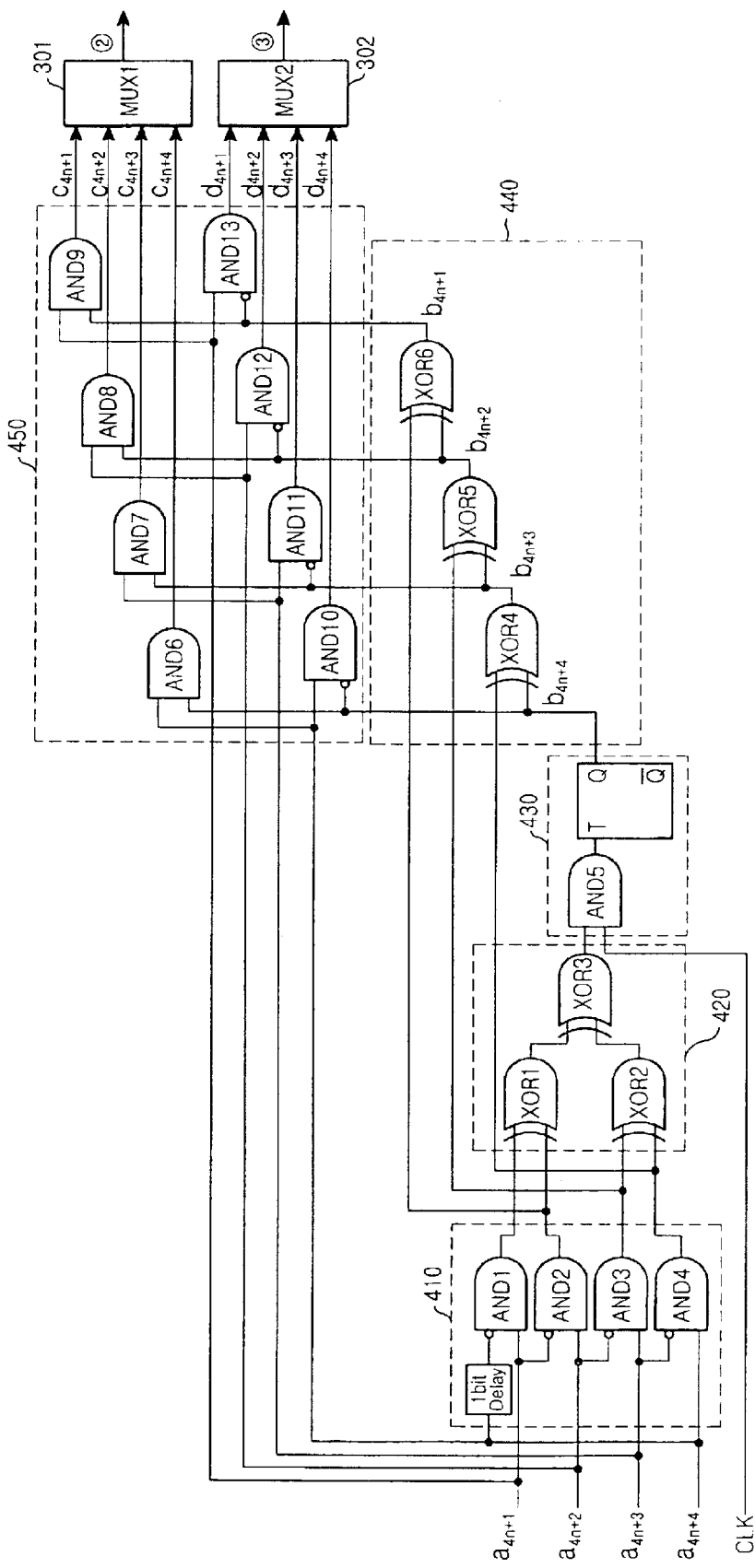
FIG. 6 is a view showing the construction of a parallel processing, duo-binary encoder according to another embodiment of the present invention.
Figure 7:
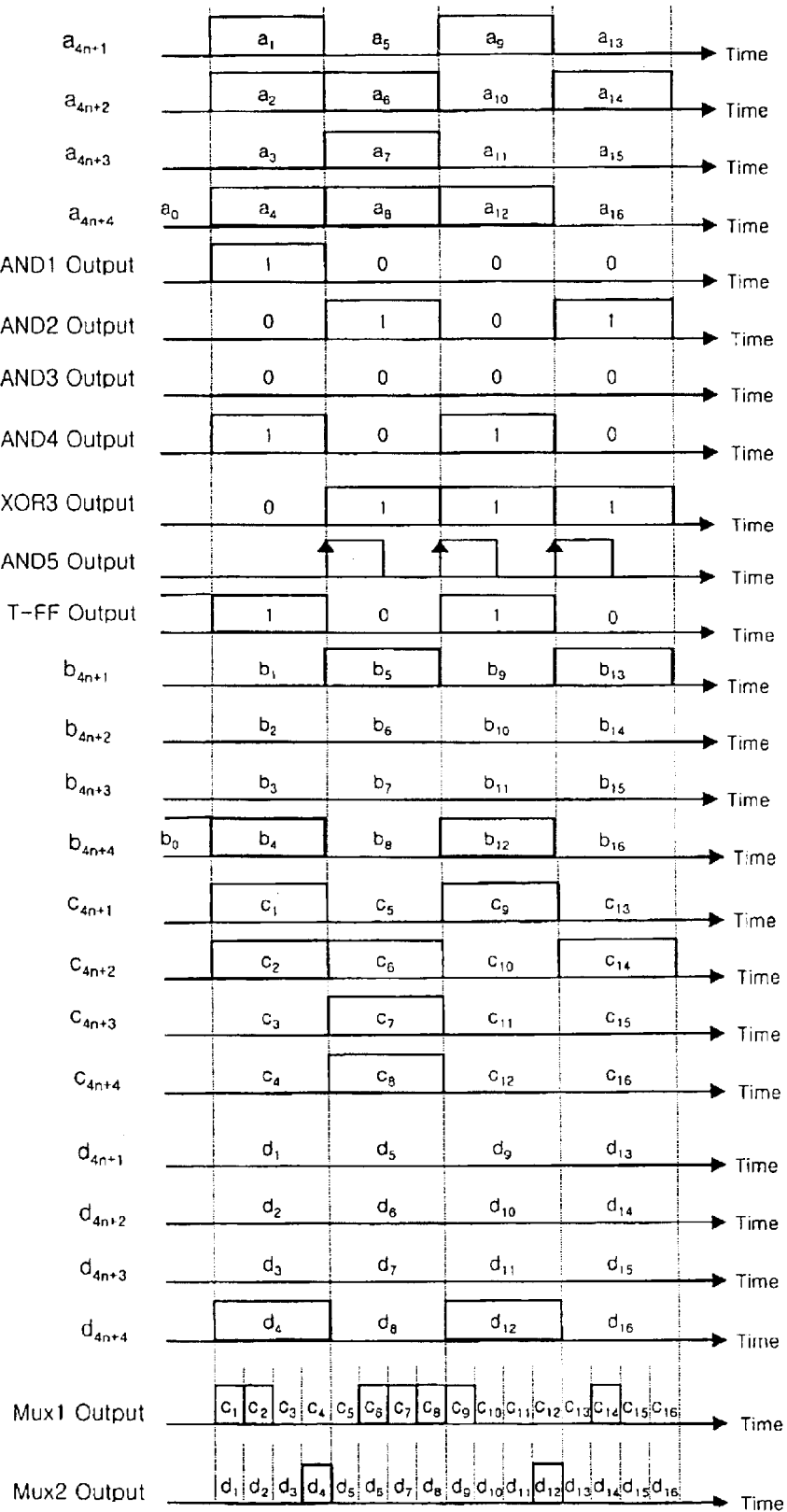
FIG. 7 is a view showing an example of input/output signals in FIG. 6.

FIG. 6 is a view showing a construction of the duo-binary encoder 400 that performs the parallel processing. This embodiment shows an example of the encoder 400 constructed by means of a feed-forward method and represents a case in which the number N of input signals is 4. For reference, FIG. 6 shows also the first and the second multiplexers 301 and 302. FIG. 7 is a view showing an example of input/output signals in FIG. 6.

Referring to FIG. 6, the duo-binary encoder 400 includes a level change detection unit 410, a judgment unit 420, a toggle unit 430, an intermediate signal generation unit 440, a phase division unit 450.

The level change detection unit 410 detects changes in the level of the input signal from 0 to 1, or from 1 to 0, in order to cause a phase shift when the level of a final modulated signal changes from 0 to 1, or from 1 to 0. The level change detection unit 410 includes a 1 bit-delayer and four AND gates (AND1 to AND4). An inverter (marked by a symbol 'o' in FIG. 6) is connected to an upper input terminal (input 1) of two input terminals of each AND gate. When the AND gate has two inputs of 0 and 1, 1 is output. In this embodiment, the AND gates (AND1 to AND4), which has an inverter connected to each input 1, detect that the input signal changes from 0 to 1. In contrast, when the inverters, which are connected to the upper input terminal of each AND gate (AND1 to AND4), are located at an input 2 part instead of the input 1, a phase shift may occur when the level of the final modulated signal changes from 1 to 0.

The judgment unit 420 judges whether the level change detection unit 410 has detected an odd number or an even number of '1's. In this way, the judgment unit 420 judges whether an odd number or an even number of '1's has been changed from '0's. For instance, the judgment unit 420 outputs 1 or 0 according to whether the total number of '1's is odd or even (see FIG. 7). The judgment unit 420 may include three XOR gates (XOR1 to XOR3) constructed in a pyramid configuration.

When an output signal of the judgment unit 420 is 1: the number of '1's in the input signal is odd, so that the toggle unit 430 toggles the output signal of the judgment unit 420. The toggle unit 430 includes an AND gate AND5 and a toggle flip-flop 432 (hereinafter, referred to as a T-FF). The toggle unit 430 ANDs the output signal of the judgment unit 420 and a clock signal, and enables the ANDed signal to pass through the T-FF, while generating an $n^{th}$ output signal $b_{4+4}$. A signal obtained by ANDing the output signal of the judgment unit 420 and the c lock signal is input to the T-FF 432, so that a toggle at each rising edge (marked by an arrow in FIG. 7) of the signal occurs in the T-FF 432.

The intermediate signal generation unit 440 determines whether to toggle an input signal $a_n$ according to the input signal $a_n$ on the basis of the $n^{th}$ output signal $b_{4+4}$ of the N channels. The intermediate signal generation unit 440 may include three XOR gates (XOR4 to XOR6).

When intermediate signals $b_{4n+1}$ to $b_{4n+4}$, generated by the intermediate signal generation unit 440 and the input signals are converted to optical duo-binary signals, the phase division unit 450 divides the optical duo-binary signals into signals having non-shifted phases and signals having 180°-shifted phases. The phase division unit 450 includes eight AND gates (AND 6 to AND 13) and four inverters (marked by a symbol 'o' in FIG. 6). The signal $b_{4n+k}$ (k=1, 2, 3, and 4) and an input signal $a_{4n+k}$ can be ANDed to obtain resultant signals $c_{4+k}$ and $d_{4n+k}$. In this embodiment, to compensate for time delay occurring when a signal passes through an XOR gate, another XOR gate having one input to which '0' is input can be inserted into the encoder 400. In addition, to compensate for time delay at an AND gate, another AND gate having one input to which '0' is input can be inserted into the encoder 400. Also, to compensate for time delay due to the T-FF, a D-FF can be used.

Figure 8:
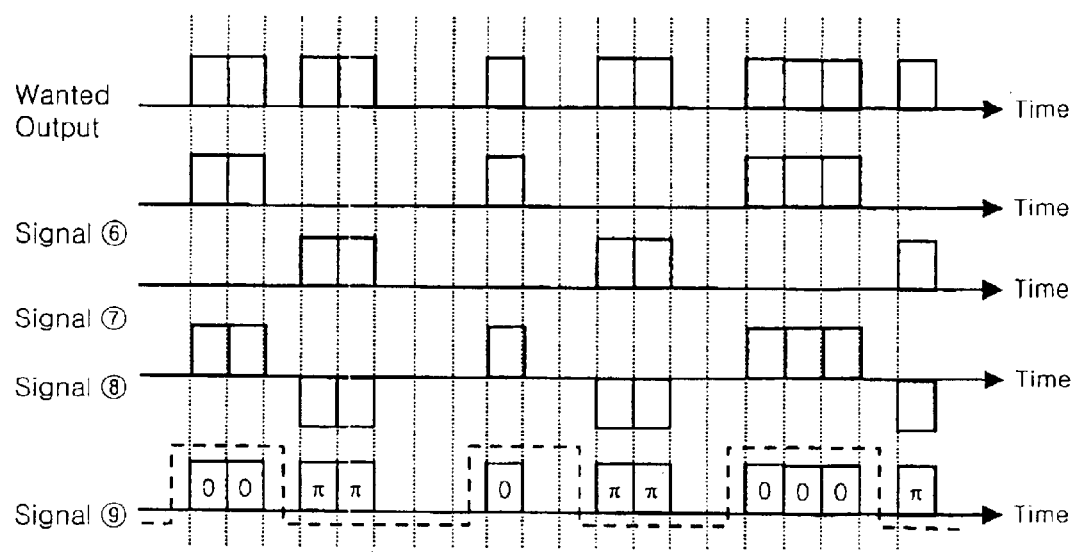
FIG. 8 is a view showing output signals at points ⑥, ⑦, ⑧, and ⑨ in FIG. 5.

Hereinafter, an operation of the optical duo-binary transmission apparatus 300 will be described. FIG. 8 shows output signals at points ⑥, ⑦, ⑧, and ⑨ in FIG. 5.

Figure 4:
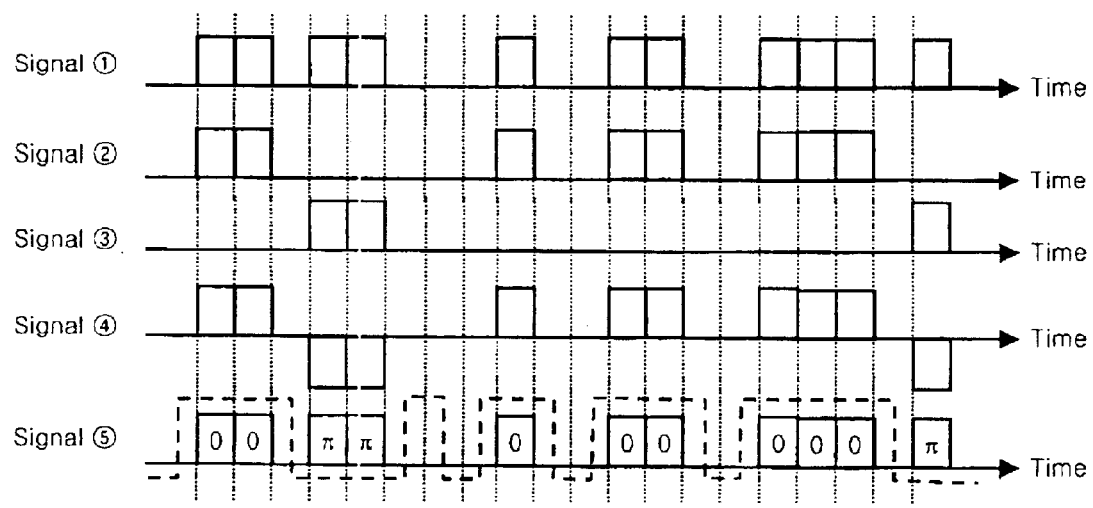
FIG. 4 is a view showing output signals at points ①, ②, ③, ④, and ⑤ in FIG. 3.

Referring to FIGS. 5 and 8, when signals $c_n$ and $d_n$ encoded through the encoder 400 are respectively time-multiplexed by means of multiplexers 301 and 302, signals ⑥ and ⑦ (i.e. Mux 1 Output and Mux 2 Output in FIG. 7) can be obtained. The signals are equal to the output signals (Signal ② and Signal ③) in FIG. 4. The output signals ⑥ and ⑦ of the multiplexers 301 and 302 are converted to a 3 level duo-binary signal ⑧ by the coupler (or adder) 303, the converted signal is amplified by the driving amplifier 304, and the amplified signal is used as a driving signal of the Mach-Zehnder interferometer type optical intensity modulator 306. A carrier output from the light source 305 is output as a 2 level optical duo-binary signal (signal ⑨), which has a phase shift, according to the driving signal of the Mach-Zehnder interferometer type optical intensity modulator 306.

According to one aspect of the present invention described above, duo-binary encoding is performed through a parallel processing before time-multiplexing is performed. This reduces and/or prevents any bottlenecks due to high speed data from occurring even with low speed electrical elements are used. In addition, the conventional feedback type encoders are not used, so that the number of input signals is not limited, as in the conventional devices.

According to another aspect, a duo-binary encoder can be constructed without requiring a high speed precoder.

As also described above, a duo-binary signal with an inverse phase characteristic can be obtained without employing an electrical low pass filter. This removes or reduces any affection due to a pseudo-random bit sequence (PRBS).

Furthermore, various embodiments of the present invention enable an optical duo-binary signal to have a phase shift at consecutive '1's, thereby removing a disadvantage in the prior art wherein no phase shift exists when the number of '0's is even.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A duo-binary encoder comprising:
   a level change detection unit for detecting that levels of data input signals of N channels input at an $n^{th}$ input of channels change from 0 to 1, or from 1 to 0;

a judgment unit for judging whether a number of level changes detected by the level change detection unit is odd or even;

a toggle unit for toggling an output signal of the judgment unit when the number of level change is odd;

an intermediate signal generation unit for determining whether phases of other channels are shifted or not, according to an data input signal on the basis of a predetermined channel of the N channels; and a phase division unit for dividing data into a first data group having non-shifted phases and a second data group which require a phase shift, according to an output signal of the intermediate signal generation unit and the data input signal, and outputting the divided first and second data groups.

2. The duo-binary encoder as claimed in claim 1, wherein the level change detection unit comprises:

N number of AND gates, each of which includes a first terminal and a second terminal, the first terminal receiving the data input signals of the N channels, the second terminal receiving inverted data of adjacent channels from among the data input signals of the N channels; and a delayer for delaying the data in the adjacent channel, which are inputted to one AND gate of the N number of AND gates, by a predetermined time.

3. The duo-binary encoder as claimed in claim 2, wherein the judgment unit includes a plurality of exclusive OR gates connected to each other in a pyramid configuration, so as to XOR an output of the level change detection unit.

4. The duo-binary encoder as claimed in claim 3, wherein the toggle unit comprises:

an AND gate for ANDing an output signal of the judgment unit and a clock signal; and a T-FF for toggling an output signal of the AND gate at each rising edge of the output signal of the AND gate.

5. The duo-binary encoder as claimed in claim 4, wherein the intermediate signal generation unit includes N−1 number of exclusive OR gates so as to XOR an output of the toggle unit and the output of the level change detection unit.

6. The duo-binary encoder as claimed in claim 5, wherein the phase division unit includes 2N number of AND gates so as to AND N number of intermediate signals, which are generated by the intermediate signal generation unit, and the N number of data input signals.

7. The duo-binary encoder as claimed in claim 6, wherein the phase division unit divides a signal group of '1's, which is individual or consecutive and differentiated by a signal of '0', into a group of '1's in odd sequences and a group of '1's in even sequences according to phases of the signal group of '1's.

8. An optical duo-binary transmission apparatus comprising:

an encoder for dividing N number of data input signals into a first data group having non-shifted phases and a second data group which require a phase shift, by a parallel processing, and outputting the divided first and second data groups;

a first/second multiplexer for multiplexing the first data group having non-shifted phases and the second data group which require a phase shift, respectively;

a coupler for coupling signals respectively multiplexed by the first/second multiplexer so as to output a 3-level signal;

a light source for outputting an optical carrier; and an optical modulator for modulating the optical carrier into an optical duo-binary signal by the 3-level signal, and outputting the modulated signal, wherein the encoder includes:

a level change detection unit for detecting that levels of data input signals of N channels inputted at an $n^{th}$ input of channels change from 0 to 1, or from 1 to 0;

a judgment unit for judging whether a number of level changes detected by the level change detection unit is odd or even;

a toggle unit for toggling an output signal of the judgment unit when the number of level change is odd;

an intermediate signal generation unit for determining whether phases of other channels are shifted or not, according to an data input signal on the basis of a predetermined channel of the N channels; and a phase division unit for dividing data into a first data group having non-shifted phases and a second data group which require a phase shift, according to an output signal of the intermediate signal generation unit and the data input signal, and outputting the divided first and second data groups.

9. The optical duo-binary transmission apparatus as claimed in claim 8, further comprising a driving amplifier for amplifying the 3-level signal so as to provide the amplified signal as a driving signal of the optical modulator.

10. A method for duo-binary encoding comprising the steps of:

detecting that levels of data input signals of N channels input at an $n^{th}$ input of channels change from 0 to 1, or from 1 to 0;

judging whether a number of detected level changes detected is odd or even;

providing a judgment output signal;

toggling the judgment output signal when the number of level change is odd;

determining whether phases of other channels are shifted or not, according to an data input signal on the basis of a predetermined channel of the N channels;

providing a determining output signal;

dividing data into a first data group having non-shifted phases and a second data group which require a phase shift, according to the determining output signal and the data input signal; and outputting the divided first and second data groups.

11. The method as claimed in claim 10, wherein detecting step includes:

receiving the data input signals of the N channels and inverted data of adjacent channels from among the data input signals of the N channels; and delaying the data in the adjacent channel, by a predetermined time.

12. The method as claimed in claim 11, wherein the toggling step includes ANDing the judgment output signal a clock signal; and toggling an output signal of the ANDing step at each rising edge of the output signal of the AND gate.

13. The method as claimed in claim 12, wherein dividing step divides a signal group of '1's, which is individual or consecutive and differentiated by a signal of '0', into a group of '1's in odd sequences and a group of '1's in even sequences according to phases of the signal group of '1's.

14. The method as claimed in claim 11 further comprising the steps of multiplexing the first data group having non-shifted phases and the second data group which require a phase shift, respectively;

coupling signals respectively multiplexed by the first/second multiplexer so as to output a 3-level signal;

outputting an optical carrier;

modulating the optical carrier into an optical duo-binary signal by the 3-level signal; and outputting the modulated signal.

* * * * *